(12) United States Patent
Matsunaga et al.

(10) Patent No.: US 7,071,040 B2
(45) Date of Patent: Jul. 4, 2006

(54) METHOD OF FABRICATING THIN FILM TRANSISTOR (75) Inventors: Naoki Matsunaga, Tokyo (JP); Kenji Sera, Tokyo (JP)

(73) Assignee: NEC Corporation, Tokyo (JP)

( * ) Notice: Subject to any disclaimer, the term of this patent is extended or adjusted under 35 U.S.C. 154(b) by 196 days.

(21) Appl. No.: 10/639,478

(22) Filed: Aug. 13, 2003

(65) Prior Publication Data

US 2004/0033648 A1 Feb. 19, 2004

(30) Foreign Application Priority Data

Aug. 15, 2002 (JP) ........................................ 2002-237048

(51) Int. Cl.
*H01L 21/00* (2006.01)
*H01L 21/84* (2006.01)

(52) U.S. Cl. ........................................ 438/154; 438/530

(58) Field of Classification Search ................ 438/104, 438/154, 163, 302, 525, 530
See application file for complete search history.

(56) References Cited

U.S. PATENT DOCUMENTS

| | | | | |
|---|---|---|---|---|
| 5,917,244 | A | * | 6/1999 | Lee et al. .................... 257/762 |
| 5,994,153 | A | * | 11/1999 | Nagel et al. .................... 438/3 |
| 6,358,783 | B1 | * | 3/2002 | Yamaguchi et al. ........ 438/163 |
| 6,744,115 | B1 | * | 6/2004 | Sasaki ........................ 257/565 |
| 6,750,792 | B1 | * | 6/2004 | Azami et al. ................ 341/100 |

FOREIGN PATENT DOCUMENTS

| | | |
|---|---|---|
| JP | 8-125022 A | 5/1996 |
| JP | 10-22507 A | 1/1998 |
| JP | 10-154815 A | 6/1998 |
| JP | 2000-252472 A | 9/2000 |
| JP | 2001-28445 A | 1/2001 |

* cited by examiner

*Primary Examiner*—Phuc T. Dang
(74) *Attorney, Agent, or Firm*—Sughrue Mion, PLLC

(57) ABSTRACT

A method of fabricating a thin film transistor including an electrically insulating substrate, a semiconductor layer formed on the substrate, and source and drain electrodes formed above source and drain regions formed in the semiconductor layer, the source and drain electrodes being composed of aluminum or aluminum alloy, the method including the steps of forming a gate electrode, implanting impurity ions into the semiconductor layer for forming the source and drain regions, forming an interlayer insulating film entirely over the substrate, forming contact holes throughout the interlayer insulating film such that the source and drain regions are exposed through the contact holes, forming an electrically conductive film composed of aluminum or aluminum alloy, in the contact holes for forming the source and drain electrodes, and thermally annealing the substrate at 275 to 350 degrees centigrade for 1.5 to 3 hours in inert atmosphere.

19 Claims, 10 Drawing Sheets

METHOD OF FABRICATING THIN FILM TRANSISTOR

BACKGROUND OF THE INVENTION

1. Field of the Invention

The invention relates to a method of fabricating a thin film transistor, and more particularly to a method of fabricating a thin film transistor including source and drain electrodes comprised of an electrically conductive film composed of aluminum or aluminum alloy.

2. Description of the Related Art

A thin film transistor (TFT) including a thin semiconductor layer such as an amorphous silicon layer and a polysilicon layer is broadly used as a driver or a switching device, for instance, for a liquid crystal display device. A thin film transistor is usually fabricated as MOSFET (Metal Oxide Semiconductor type Field Effect Transistor) including an electrically insulating substrate such as a glass substrate and a thin semiconductor layer formed on the substrate and acting as an active region. A thin film transistor provides an advantage that a driver as mentioned above can be readily fabricated. When a thin film transistor is used in an active matrix type liquid crystal display device, for instance, the thin film transistor is designed to be driven by a driver integrated circuit as a switching device for switching pixels.

A thin film transistor including a thin semiconductor layer composed of poly-semiconductor provides greater carrier mobility than the same provided by a thin film transistor including a thin semiconductor layer composed of amorphous semiconductor, and hence, can operate at a higher rate than a thin film transistor including a thin semiconductor layer composed of amorphous semiconductor. In addition, a switching device for driving pixels and a driver integrated circuit can be fabricated simultaneously on a common substrate in a thin film transistor including a thin semiconductor layer composed of poly-semiconductor. Thus, a thin film transistor including a thin semiconductor layer composed of poly-semiconductor satisfies requirements of a recent liquid crystal display device such as fabrication in a small size or enhancement in a resolution.

Figure 1:
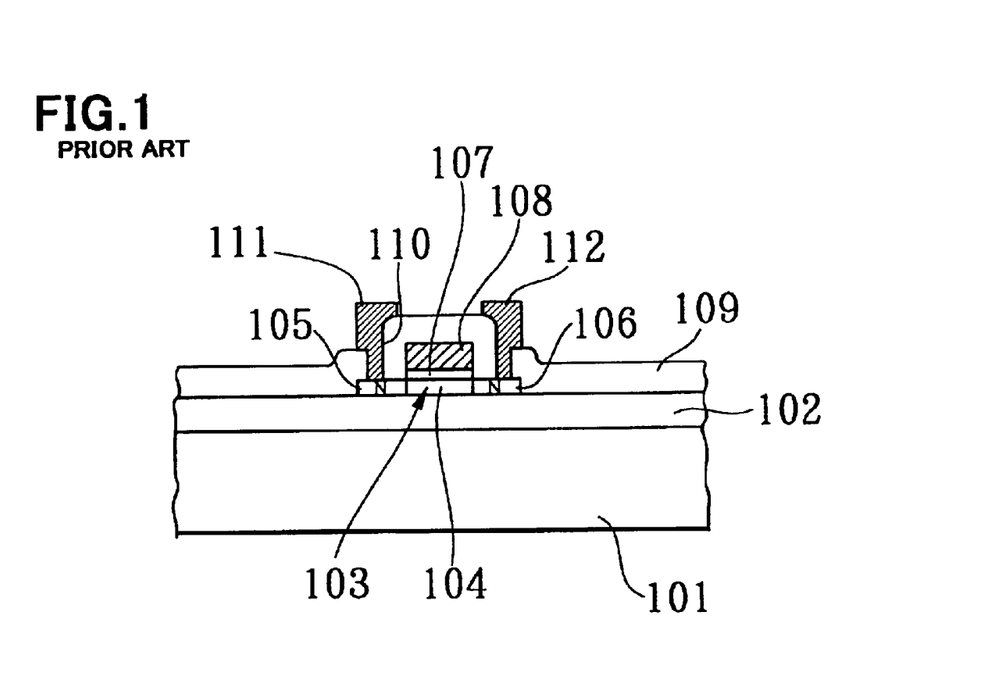
FIG. 1 is a cross-sectional view of a conventional thin film transistor.

FIG. 1 is a cross-sectional view of a conventional thin film transistor having a so-called top-gate structure in which a gate electrode is formed above a thin semiconductor layer.

As illustrated in FIG. 1, the thin film transistor is comprised of an electrically insulating substrate 101 such as a glass substrate, an electrically insulating film 102 formed on the substrate 101, a thin semiconductor layer 103 comprised of a polysilicon film and formed on the electrically insulating film 102, and including a channel region 104 formed substantially centrally of the thin semiconductor layer 103 and source and drain regions 105 and 106 formed around the channel region 104, a gate insulating film 107 formed on the channel region 104, a gate electrode 108 formed on the gate insulating film 107, an interlayer insulating film 109 composed of a silicon oxide film and formed entirely over the substrate 101, and source and drain electrodes 111 and 112 formed in contact holes 110 formed throughout the interlayer insulating film 109 such that the source and drain regions 105 and 106 are exposed through the contact holes 110.

The gate electrode 108 is composed of refractory metal such as chrome (Cr), molybdenum (Mo) or tungsten (W). The source and drain electrodes 111 and 112 are comprised of an electrically conductive film composed of aluminum or aluminum alloy predominantly containing aluminum, because aluminum and aluminum alloy are suitable to small geometry process by etching, and have a small resistance.

Figure 2:
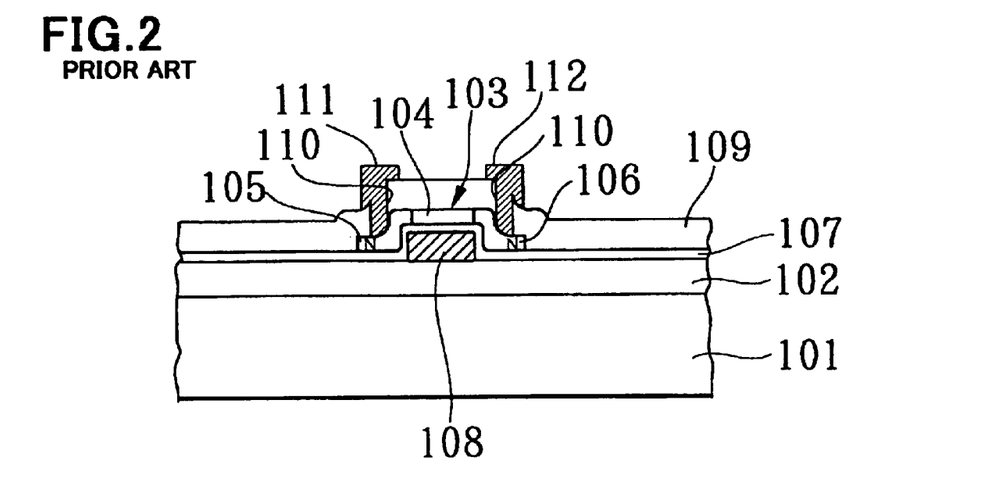
FIG. 2 is a cross-sectional view of another conventional thin film transistor.

FIG. 2 is a cross-sectional view of another conventional thin film transistor having so-called bottom-gate structure in which a gate electrode is formed below a thin semiconductor layer.

The thin film transistor illustrated in FIG. 2 is different from the thin film transistor illustrated in FIG. 1 only in location of the gate electrode 108. The thin film transistor illustrated in FIG. 2 operates under the same principle as that of the thin film transistor illustrated in FIG. 1.

In fabrication of the conventional thin film transistors illustrated in FIGS. 1 and 2, there are carried out many processes such as plasma-etching for patterning a gate metal film such as a chrome film into the gate electrode 108, laser annealing for activating the thin semiconductor layer 103, and plasma-etching of the interlayer insulating film 109 for forming the contact holes 110 therethrough.

These processes cause a problem of crystal defects in the thin semiconductor layer 103, the gate insulating film 107 and/or an interface between the thin semiconductor layer 103 and the gate insulating film 107, because the layers 103 and 107 are damaged by static electricity caused by the plasmas. Such crystal defects further cause a problem of variance in characteristics of a thin film transistor such as a threshold voltage, resulting in deterioration in reliability to a thin film transistor. Accordingly, it is long desired to provide a solution to a problem of crystal defects.

Japanese Patent Application Publication No. 2000-252472A has suggested a method of fabricating such a thin film transistor as mentioned above.

The method includes the steps of forming a thin semiconductor layer comprised of a polysilicon layer, on an electrically insulating substrate, implanting ions of impurity such as boron or phosphorus into a part of the polysilicon layer for forming source and drain regions in the polysilicon layer, forming an interlayer insulating film such as a silicon oxide film over the substrate by plasma-enhanced chemical vapor deposition (CVD), and thermally annealing the substrate at 600 degrees centigrade for an hour for activating the polysilicon film and reducing crystal defects in both the gate insulating film and an interface between the gate insulating film and the polysilicon film.

Japanese Patent Application Publication No. 10-154815A has suggested another method of fabricating such a thin film transistor as mentioned above.

The method includes the steps of forming a thin semiconductor layer comprised of an amorphous silicon film, on an electrically insulating substrate, forming a gate insulating film on the substrate, forming a gate electrode on the gate insulating film above the amorphous silicon film, implanting ions of impurity into a part of the amorphous silicon layer for forming source and drain regions in the amorphous silicon layer, forming a layer composed of one of Cr, Mo, Ta and W, and thermally annealing the layer at 200 to 400 degrees centigrade for a few hours to diffuse Cr, Mo, Ta or W into the source and drain regions for forming a thin silicide layer at surfaces of the source and drain regions.

However, the above-mentioned conventional methods are accompanied with a problem that when source and drain electrodes are comprised of an electrically conductive film composed of aluminum or aluminum alloy predominantly containing aluminum, it would not be possible to prevent crystal defects with the result of variance in characteristics of a thin film transistor.

Specifically, when a gate electrode is formed in the conventional methods of fabricating a thin film transistor, there are carried out many processes such as plasma-etching for patterning a gate metal film such as a chrome film, laser annealing for activating a thin semiconductor layer, and plasma-etching of an interlayer insulating film for forming contact holes therethrough. These processes cause crystal defects in a thin semiconductor layer, a gate insulating film and/or an interface between a thin semiconductor layer and a gate insulating film, because a thin semiconductor layer and a gate insulating film are damaged by static electricity caused by plasmas. This results in variance in characteristics of a thin film transistor such as a threshold voltage.

In the firstly mentioned conventional method of fabricating a thin film transistor, the substrate is thermally annealed at 600 degrees centigrade for an hour subsequently to the formation of source and drain electrodes. Even if the substrate were thermally annealed prior to the formation of source and drain electrodes, crystal defects might be caused when source and drain electrodes are formed. Hence, thermally annealing carried out prior to the formation of source and drain electrodes does not contribute to improvement in crystal defects.

In the secondly mentioned conventional method of fabricating a thin film transistor, the substrate is thermally annealed at 200 to 400 degrees centigrade for a few hours after the formation of source and drain regions, but before the formation of source and drain electrodes. Similarly to the firstly mentioned conventional method, the secondly mentioned conventional method is accompanied with a problem that crystal defects might be caused when source and drain electrodes are formed. As a result, the secondly mentioned conventional method does not contribute to improvement in crystal defects.

Japanese Patent Application Publication No. 8-125022A has suggested a method of fabricating a semiconductor device, including the steps of forming a refractory metal silicide film on a semiconductor substrate in a certain area, forming a silicon film on the refractory metal silicide film, forming an electrode wiring electrically connecting the silicon film to the certain area of the substrate, forming a polysilicon film on an electrically insulating film formed on the substrate, patterning the polysilicon film into a device, and thermally annealing the substrate in oxidizing atmosphere at a predetermined timing after the formation of the polysilicon film.

Japanese Patent Application Publication No. 10-22507A has suggested a method of fabricating a thin film transistor array, including the steps of a first metal film composed of aluminum, on an electrically insulating transparent substrate, forming a second metal film composed of aluminum alloy predominantly containing aluminum, on the first metal film, and forming an anode oxide film by partially anode-oxidizing the second metal film such that a portion of the first and second metal films which acts as a gate or a source electrode remains not removed.

Japanese Patent Application Publication No. 2001-28445A has suggested a method of fabricating a semiconductor device, including the steps of forming a thin film transistor on an electrically insulating film, forming an electrically insulating film over the thin film transistor, and thermally annealing the substrate.

SUMMARY OF THE INVENTION

In view of the above-mentioned problems in the conventional method, it is an object of the present invention to provide a method of fabricating a thin film transistor which method can prevent variance in characteristics in thin film transistors including source and drain electrodes each comprised of an electrically conductive film composed of aluminum or aluminum alloy predominantly containing aluminum.

There is provided a method of fabricating a thin film transistor including an electrically insulating substrate, a semiconductor layer formed on the substrate, and source and drain electrodes formed above source and drain regions formed in the semiconductor layer, the source and drain electrodes being composed of aluminum or aluminum alloy, the method comprising the steps of (a) forming a gate electrode electrically insulated from the semiconductor layer through a gate insulating film, (b) implanting ions of impurity having a predetermined electrical conductivity, into at least a part of the semiconductor layer for forming the source and drain regions, (c) forming an interlayer insulating film entirely over the substrate, (d) forming contact holes throughout the interlayer insulating film such that at least a part of the source and drain regions is exposed through the contact holes, (e) forming an electrically conductive film composed of aluminum or aluminum alloy, in the contact holes for forming the source and drain electrodes electrically connecting the source and drain regions through the contact holes, and (f) thermally annealing the substrate at 275 to 350 degrees centigrade for 1.5 to 3 hours in inert atmosphere.

It is preferable that the substrate is thermally annealed in the step (f) immediately after the source and drain electrodes have been formed in the step (e).

For instance, the gate electrode is formed above the semiconductor layer in the step (a). As an alternative, the gate electrode may be formed below the semiconductor layer in the step (a).

It is preferable that the gate electrode is used as a mask in formation of the source and drain regions in the step (b).

It is preferable that the ions are implanted twice into the semiconductor layer in the step (b) in different impurity concentrations such that the resultant source and drain regions have a lightly-doped drain (LDD) structure.

The method may further include the step of (g) activating the semiconductor layer and applying hydrogen-plasma to the semiconductor layer, the step (g) being to be carried out between the steps (b) and (c).

It is preferable that the interlayer insulating film is formed in the step (c) so as to have a multi-layered structure.

It is preferable that the semiconductor layer is comprised of a polysilicon film.

It is preferable that the substrate is thermally annealed in the step (f) in nitrogen atmosphere.

The advantages obtained by the aforementioned present invention will be described hereinbelow.

In accordance with the present invention, the substrate is thermally annealed at 275 to 350 degrees centigrade for 1.5 to 3 hours after the formation of source and drain electrodes composed of aluminum or aluminum alloy predominantly containing aluminum. This ensures improvement in crystal defects, and hence, it would be possible to prevent variance in characteristics in thin film transistors, even if the transistors include source and drain electrodes composed of aluminum or aluminum alloy predominantly containing aluminum.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 3A:
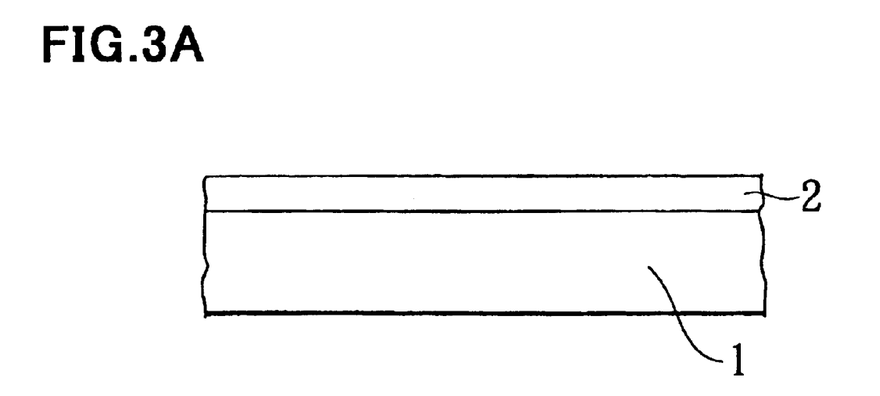
FIGS. 3A to 3K are cross-sectional views of a thin film transistor in respective steps of a method of fabricating a thin film transistor, in accordance with the first embodiment of the present invention.
Figure 3B:
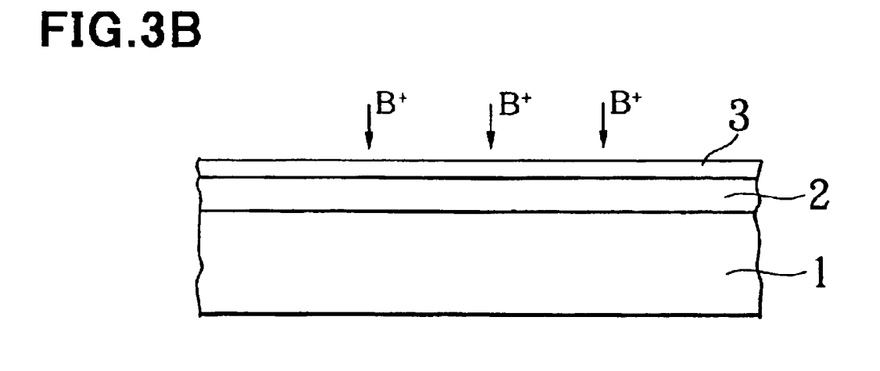
Figure 3C:
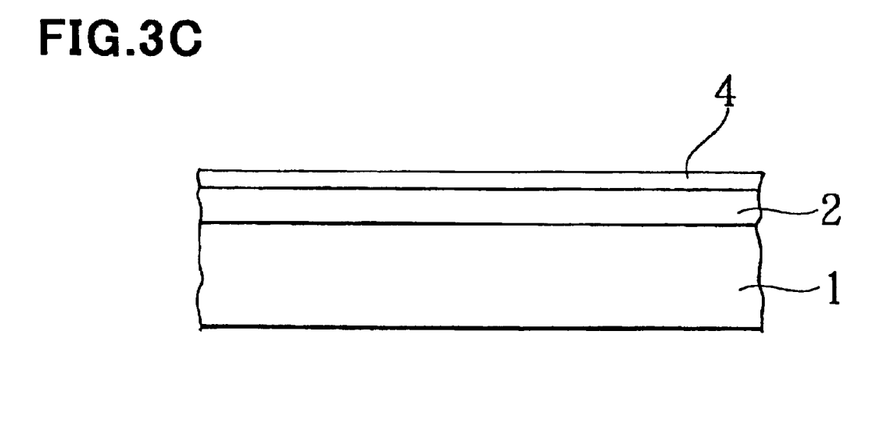
Figure 3D:
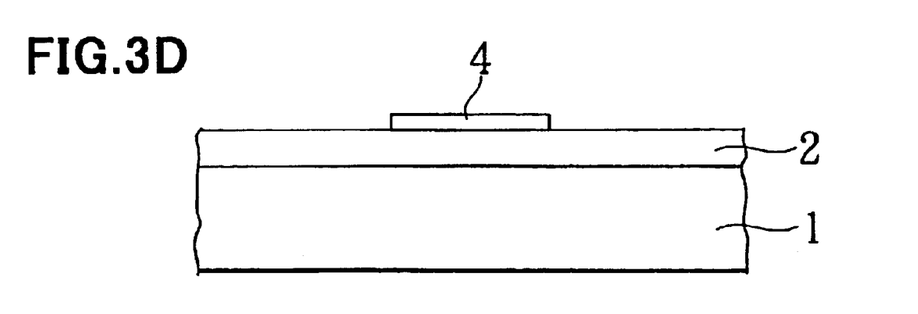
Figure 3E:
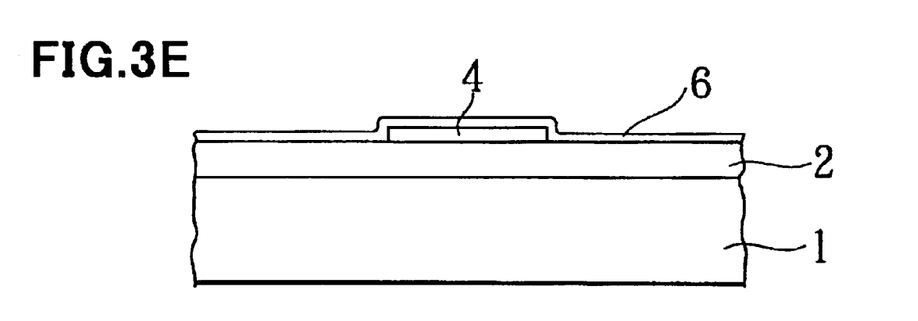
Figure 3F:
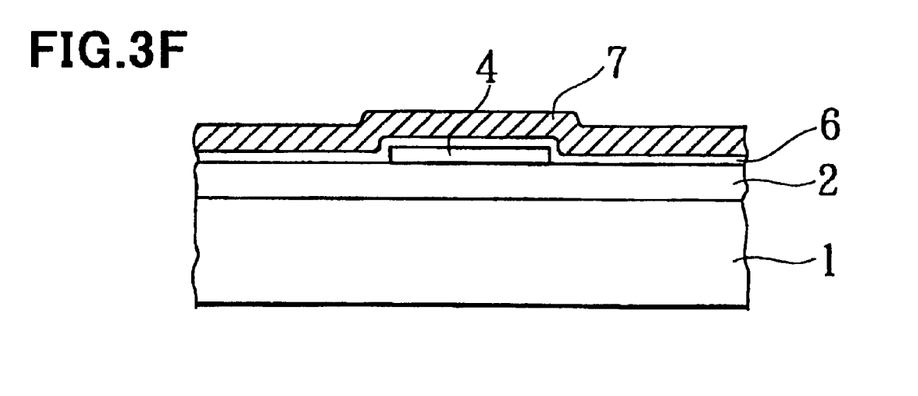
Figure 3G:
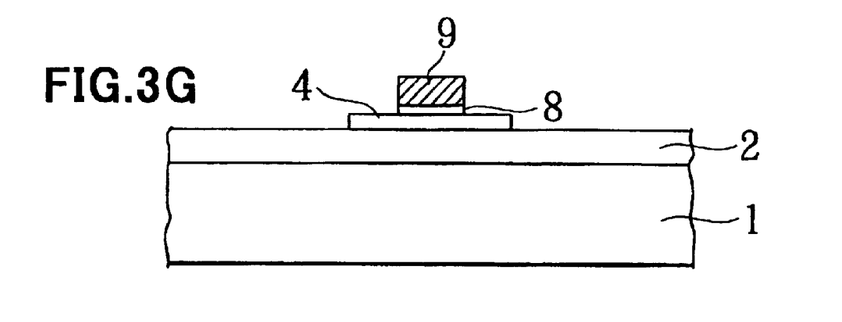
Figure 3H:
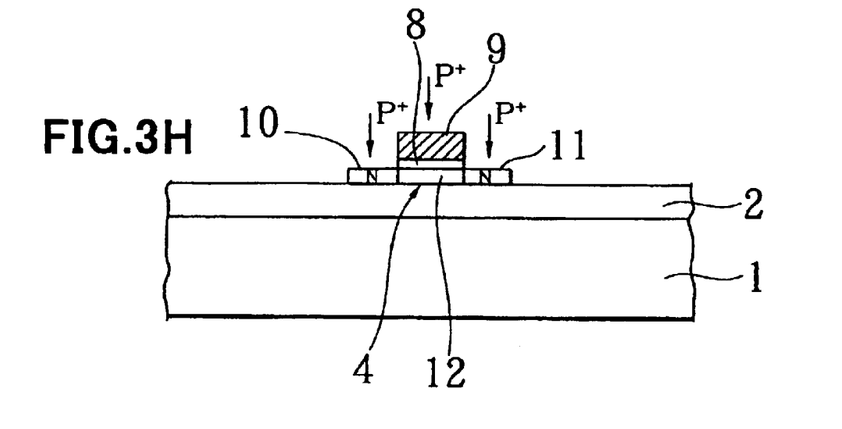
Figure 3I:
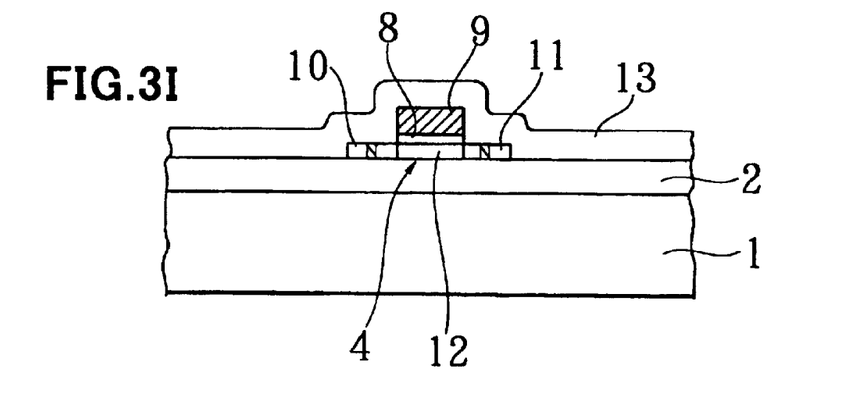
Figure 3J:
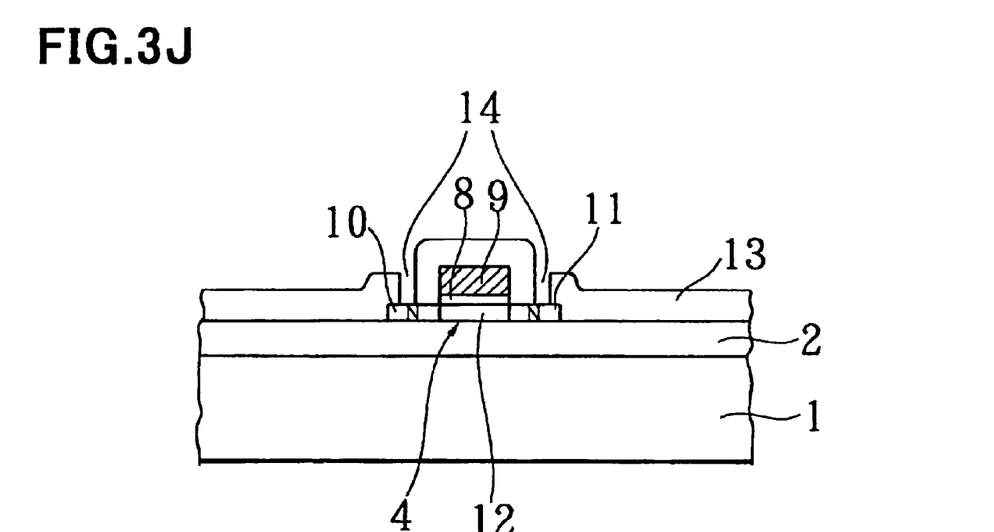
Figure 3K:
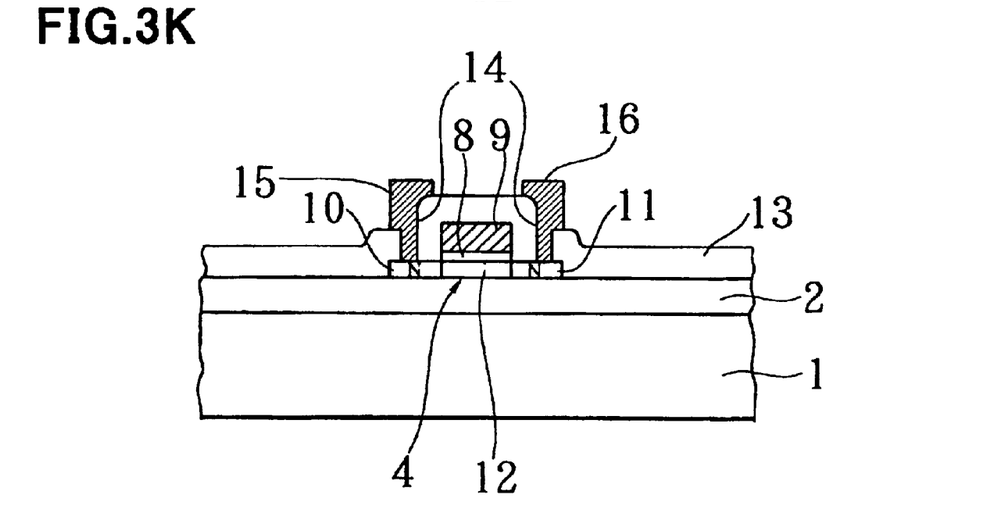
Figure 4:
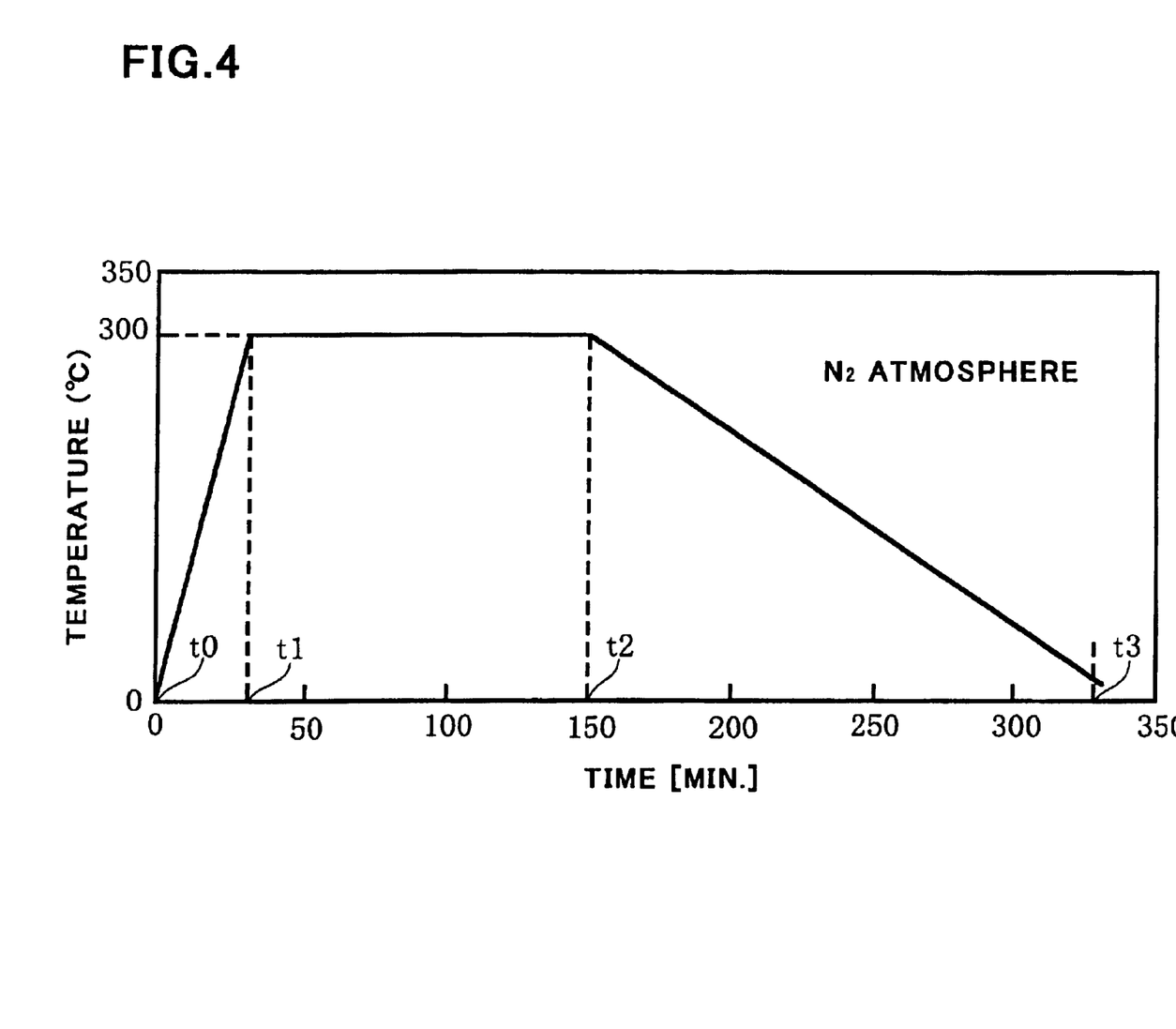
FIG. 4 is a graph showing a temperature profile in annealing carried out in the method in accordance with the first embodiment.

FIGS. 3A to 3K are cross-sectional views of a thin film transistor in respective steps of a method of fabricating a thin film transistor, in accordance with the first embodiment, and FIG. 4 is a graph showing a temperature profile in annealing carried out in the method. Hereinbelow is explained a method of fabricating a thin film transistor, in accordance with the first embodiment.

In the first embodiment, an n-channel type thin film transistor having a top-gate structure is fabricated.

First, as illustrated in FIG. 3A, an underlying film 2 is formed on an electrically insulating substrate 1 by chemical vapor deposition (CVD). The substrate 1 is comprised of a glass substrate having a thickness of about 0.7 mm. The underlying film 2 is comprised of a silicon oxide film having a thickness of about 300 nm. The underlying film 2 acts as a buffer film for preventing intrusion of impurity which would exert harmful influence on characteristics of a thin film transistor, into a later mentioned thin semiconductor layer from the substrate 1.

Then, as illustrated in FIG. 3B, an amorphous silicon film 3 having a thickness of about 60 nm is formed all over the underlying film 2 by CVD.

Then, ions of p-type impurity such as boron (B) are implanted entirely into the amorphous silicon film 3 in order to activate the amorphous silicon film 3 which will make a channel region of a thin film transistor. It should be noted that it is not always necessary to carry out such ion-implantation into the amorphous silicon film 3.

Then, as illustrated in FIG. 3C, energy beams are radiated entirely over the amorphous silicon film 3 from an excimer laser to reform the amorphous silicon film 3 into a polysilicon film 4. Simultaneously, the polysilicon film 4 into which boron ions were implanted is annealed by the energy beams, and thus, activated.

Thus, the polysilicon film 4 as a thin semiconductor layer, having a thickness of about 60 nm, is formed on the substrate 1 with the underlying layer 2 being sandwiched therebetween.

Then, as illustrated in FIG. 3D, the polysilicon film 4 is patterned into an island by photolithography and plasma-etching such that an unnecessary portion of the polysilicon film 4 is selectively removed by the plasma-etching and a portion of the polysilicon film 4 necessary for fabricating a thin film transistor remains unetched. In such plasma-etching, the island-shaped polysilicon film 4 is damaged by static electricity caused by plasma, resulting in that crystal defects are likely to be caused in the polysilicon film 4.

Then, as illustrated in FIG. 3E, an electrically insulating film 6 is formed all over the polysilicon film 4 and the underlying film 2 by CVD. The electrically insulating film 6 is composed of silicon oxide, and has a thickness of about 50 nm.

Then, as illustrated in FIG. 3F, a gate metal film 7 is formed over the electrically insulating film 6 by sputtering. The gate metal film 7 is composed of chrome and has a thickness of about 200 nm.

Then, as illustrated in FIG. 3G, unnecessary portions of the electrically insulating film 6 and the gate metal film 7 are removed by photolithography and plasma-etching, thereby a gate insulating film 8 and a gate electrode 9 both having a desired shape are formed. During the plasma-etching, the polysilicon film 4, the gate insulating film 8, and an interface between the polysilicon film 4 and the gate insulating film 8 are damaged by static electricity caused by plasma, resulting in that crystal defects are likely to be caused in them.

Then, as illustrated in FIG. 3H, ions of n-type impurity such as phosphorus (P) is implanted partially into the polysilicon film 4 in self-alignment manner in which the gate electrode 9 acts as a mask, thereby n-type source region 10 and drain region 11 are formed in the polysilicon film 4 around the gate electrode 9, and further, a channel region 12 is formed in an area located below the gate electrode 9 and sandwiched between the source and drain regions 10 and 11.

Then, the polysilicon film 4 into which phosphorus ions were implanted is activated by laser annealing, and then, hydrogen plasma is applied to the polysilicon film 4 such that carriers readily run through the channel region 12.

When the n-type source and drain regions 10 and 11 are formed by implanting ions of n-type impurity into the polysilicon film 4, the source and drain regions 10 and 11 may be designed to have a lightly-doped drain (LDD) structure by carrying out ion-implantation twice in different impurity concentrations. In particular, when a thin film transistor has to be designed to have a quite small channel length, a LDD structure is quite effective in enhancing reliability in operation of a thin film transistor, because a LDD structure prevents concentration of electric field to a drain region.

Then, as illustrated in FIG. 3I, an interlayer insulating film 13 is formed all over the substrate 1 by CVD. The interlayer insulating film 13 is composed of silicon oxide and has a thickness of about 300 nm.

Then, as illustrated in FIG. 3J, an unnecessary portion of the interlayer insulating film 13 is removed by photolithography and plasma-etching, thereby there are formed contact holes 14 throughout the interlayer insulating film 13. The source and drain regions 10 and 11 are partially exposed through the contact holes 14. During the plasma-etching, the polysilicon film 4, the gate insulating film 8, and an interface between the polysilicon film 4 and the gate insulating film 8 are damaged by static electricity caused by plasma, resulting in that crystal defects are likely to be caused in them.

Then, as illustrated in FIG. 3K, an aluminum film is formed all over the resultant illustrated in FIG. 3J by sputtering such that the contact holes 14 are filled with aluminum. Then, the aluminum film is patterned into a desired pattern by removing an unnecessary portion of the aluminum film by photolithography and plasma-etching. Thus, there are formed source and drain electrodes 15 and 16 electrically connecting to the source and drain regions 10 and 11 through the contact holes 14, respectively, and there is further formed a wiring layer (not illustrated). During the plasma-etching, the polysilicon film 4, the gate insulating film 8, and an interface between the polysilicon film 4 and the gate insulating film 8 are damaged by static electricity caused by plasma, resulting in that crystal defects are likely to be caused in them.

Immediately after the formation of the source and drain electrodes 15 and 16, the substrate 1 is put into a furnace, and then, thermally annealed in nitrogen atmosphere in accordance with a temperature profile illustrated in FIG. 4.

Specifically, as illustrated in FIG. 4, a temperature in the furnace is raised to 300 degrees centigrade from a room temperature in about 30 minutes during t0 to t1, and then, is kept at about 300 degrees centigrade for about two hours during t1 to t2, and then, is lowered to a room temperature from about 300 degrees centigrade in about three hours during t2 to t3. The substrate 1 is thermally annealed by keeping the furnace at about 300 degrees centigrade in about two hours during t1 to t2, resulting in that crystal defects caused by static electricity during plasma-etching in the polysilicon film 4, the gate insulating film 8, and an interface between the polysilicon film 4 and the gate insulating film 8 are reduced.

Then, there is formed a pixel electrode (not illustrated) electrically connecting to the source electrode 15 or the drain electrode 16. Then, a planarization film and a passivation film (not illustrated) are formed all over a resultant. Thus, a thin film transistor is completed.

In the above-mentioned method in accordance with the first embodiment, the substrate 1 is thermally annealed in nitrogen atmosphere at about 300 degrees centigrade for about two hours immediately after the formation of the source and drain electrodes 15 and 16. Hence, even if processes such as plasma-etching for patterning the gate metal film 7 into the gate electrode 9, laser annealing for activating the polysilicon film 4, and plasma-etching for forming the contact holes 14 throughout the interlayer insulating film 13 are carried out, it would be possible to reduce crystal defects caused in the polysilicon film 4, the gate insulating film 8, and an interface between the poly-silicon film and the gate insulating film 8 during the processes. In addition, it would be also possible to control carrier scattering in crystal defects as a result of reduction in crystal defects.

As a result, it is possible to reduce variance in a threshold in a thin film transistor. Specifically, such variance can be reduced by about 40%. For instance, variance of 0.1V is reduced down to 0.06V. Furthermore, the above-mentioned thermal annealing reduces a contact resistance of the source and drain electrodes 15 and 16 both comprised of an aluminum film.

In a liquid crystal display device including the above-mentioned thin film transistor as a driver, the source and drain electrodes 15 and 16 define gate and data lines, respectively. A liquid crystal display device is usually designed to include a protector for protecting the liquid crystal display device from static electricity caused by plasma. In steps to be carried out after the formation of the source and drain electrodes 15 and 16, such a protector operates, that is, the protector protects the polysilicon film 4, the gate insulating film 8 and so on from static electricity caused by plasma.

Thus, it would be possible to effectively reduce crystal defects by thermally annealing the substrate 1 in the above-mentioned way immediately after the formation of the source and drain electrodes 15 and 16. As a result, variance in characteristics of a thin film transistor is reduced, ensuring enhancement in reliability of a thin film transistor.

[Second Embodiment]

Figure 5A:
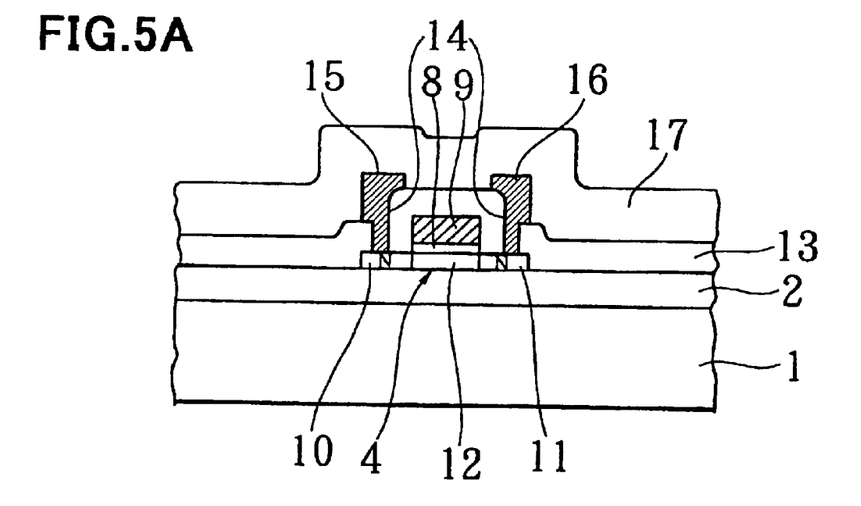
FIGS. 5A and 5B are cross-sectional views of a thin film transistor in respective steps of a method of fabricating a thin film transistor, in accordance with the second embodiment of the present invention.
Figure 5B:
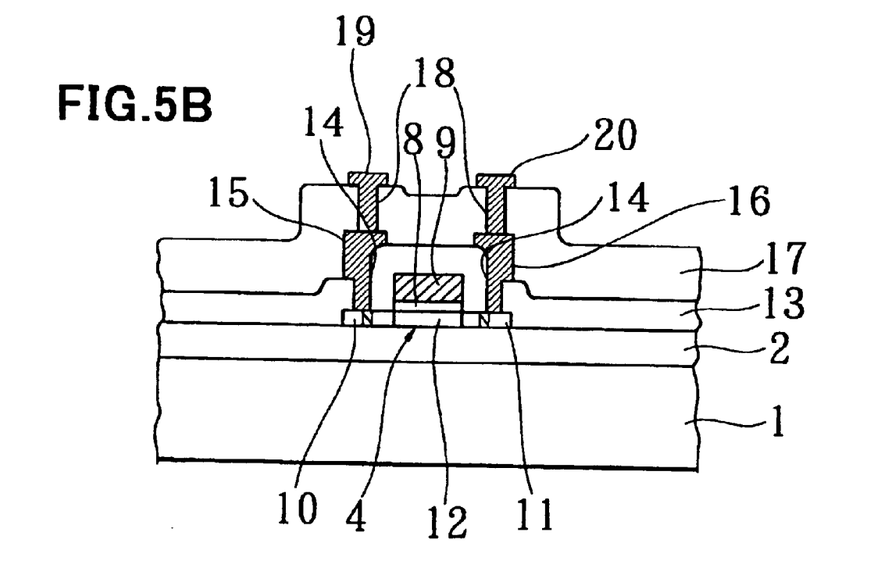

FIGS. 5A and 5B are cross-sectional views of a thin film transistor in main steps of a method of fabricating a thin film transistor, in accordance with the second embodiment.

Parts or elements that correspond to those of the first embodiment have been provided with the same reference numerals, and operate in the same manner as corresponding parts or elements in the first embodiment, unless explicitly explained hereinbelow.

The second embodiment is different from the first embodiment in that an interlayer insulating film is designed to have a multi-layered structure.

Specifically, as illustrated in FIG. 5A, a second interlay insulating film 17 is formed all over the substrate 1 by CVD subsequently to the step having been explained with reference to FIG. 3K. The second interlayer insulating film 17 is composed of silicon nitride and has a thickness of about 400 nm. The second interlayer insulating film 17 and the interlayer insulating film 13 define a multi-layered interlay insulating film.

Then, as illustrated in FIG. 5B, an unnecessary portion of the second interlayer insulating film 17 is removed by photolithography and plasma-etching, thereby there are formed contact holes 18 through which the source and drain electrodes 15 and 16 are partially exposed. During the plasma-etching, the polysilicon film 4, the gate insulating film 8, and an interface between the polysilicon film 4 and the gate insulating film 8 are damaged by static electricity caused by plasma, resulting in that crystal defects are likely to be caused in them.

Then, an aluminum film is formed all over a resultant by sputtering such that the contact holes 18 are filled with aluminum. Then, the aluminum film is patterned into a desired pattern by removing an unnecessary portion of the aluminum film by photolithography and plasma-etching. Thus, there are formed source and drain electrodes 19 and 20 electrically connecting to the source and drain electrodes 15 and 16 through the contact holes 18, respectively, and there is further formed a wiring layer (not illustrated). During the plasma-etching, the polysilicon film 4, the gate insulating film 8, and an interface between the polysilicon film 4 and the gate insulating film 8 are damaged by static electricity caused by plasma, resulting in that crystal defects are likely to be caused in them.

Immediately after the formation of the source and drain electrodes 15, 19 and 16, 20, the substrate 1 is put into a furnace, and then, thermally annealed in nitrogen atmosphere in accordance with a temperature profile illustrated in FIG. 4, similarly to the first embodiment.

Specifically, the substrate 1 is thermally annealed by keeping the furnace at about 300 degrees centigrade in about two hours during t1 to t2, resulting in that crystal defects caused by static electricity during plasma-etching in the polysilicon film 4, the gate insulating film 8, and an interface between the polysilicon film 4 and the gate insulating film 8 are reduced.

Then, there is formed a pixel electrode (not illustrated) electrically connecting to the source electrode 19 or the drain electrode 20. Then, a planarization film and a passivation film (not illustrated) are formed all over a resultant. Thus, a thin film transistor is completed.

Since the second embodiment is identical to the first embodiment except that an interlayer insulating film has a multi-layered structure including the interlayer insulating films 13 and 17, the second embodiment presents the same advantages as those presented by the first embodiment.

[Third Embodiment]

FIGS. 6A to 6I are cross-sectional views of a thin film transistor in respective steps of a method of fabricating a thin film transistor, in accordance with the third embodiment. Hereinbelow is explained a method of fabricating a thin film transistor, in accordance with the third embodiment, with reference to FIGS. 6A and 6I.

The third embodiment is different from the first embodiment in that the third embodiment is applied to a thin film transistor having a bottom-gate structure, whereas the first embodiment is applied to a thin film transistor having a top-gate structure.

Figure 6A:
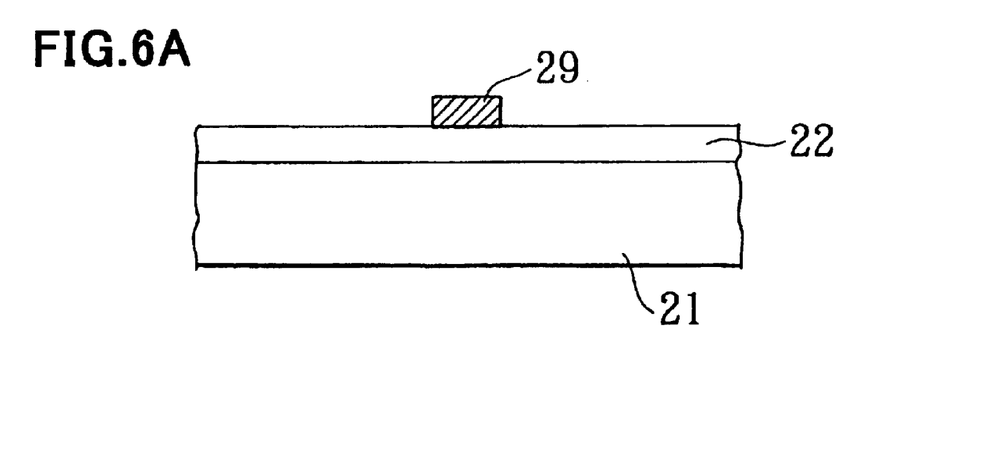
FIGS. 6A to 6I are cross-sectional views of a thin film transistor in respective steps of a method of fabricating a thin film transistor, in accordance with the third embodiment of the present invention.

First, as illustrated in FIG. 6A, an underlying film 22 is formed on an electrically insulating substrate 21 by CVD. The substrate 21 is comprised of a glass substrate having a thickness of about 0.7 mm. The underlying film 22 is comprised of a silicon oxide film having a thickness of about 400 nm. The underlying film 22 acts as a buffer film for preventing intrusion of impurity which would exert harmful influence on characteristics of a thin film transistor, into a later mentioned thin semiconductor layer from the substrate 21.

Then, a gate metal film is formed all over the substrate 21 by sputtering. The gate metal film is composed of chrome, and has a thickness of about 200 nm.

Then, an unnecessary portion of the gate metal film is removed by photolithography and plasma-etching, thereby a gate electrode 29 having a desired shape is formed.

Figure 6B:
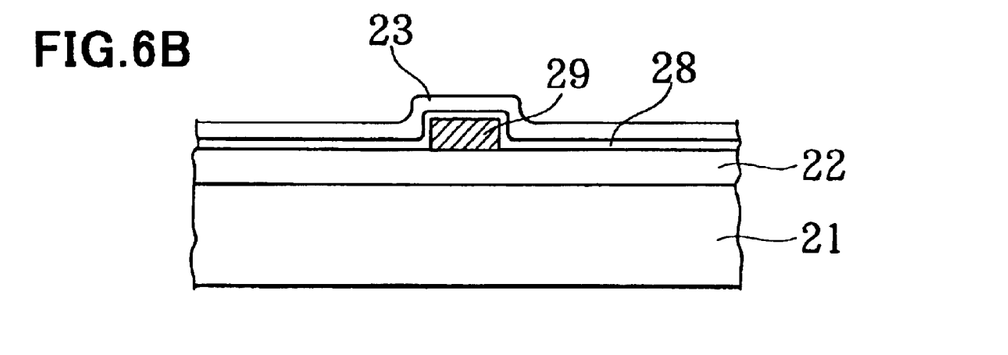

Then, as illustrated in FIG. 6B, a gate insulating film 28 is formed all over the substrate 21 by CVD. The gate insulating film 28 is composed of silicon oxide and has a thickness of about 60 nm.

Then, an amorphous silicon film 23 is formed all over the substrate 21 by CVD by a thickness of about 60 nm.

Figure 6C:
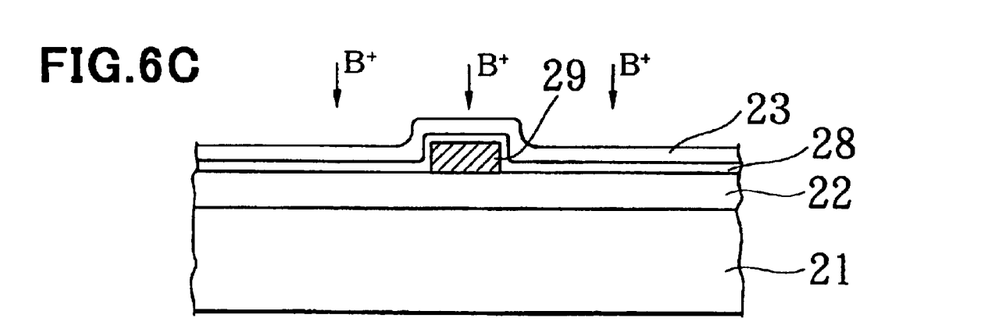

Then, as illustrated in FIG. 6C, ions of p-type impurity such as boron (B) are implanted entirely into the amorphous silicon film 23 in order to activate the amorphous silicon film 23 which will make a channel region of a thin film transistor. It should be noted that it is not always necessary to carry out such ion-implantation into the amorphous silicon film 23.

Figure 6D:
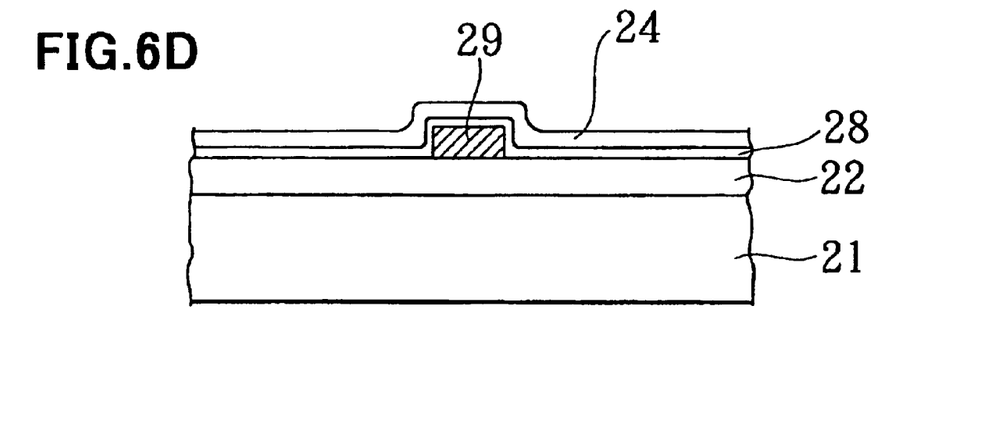

Then, as illustrated in FIG. 6D, energy beams are radiated entirely over the amorphous silicon film 23 from an excimer laser to reform the amorphous silicon film 23 into a polysilicon film 24. Simultaneously, the polysilicon film 24 into which boron ions were implanted is annealed by the energy beams, and thus, activated.

Figure 6E:
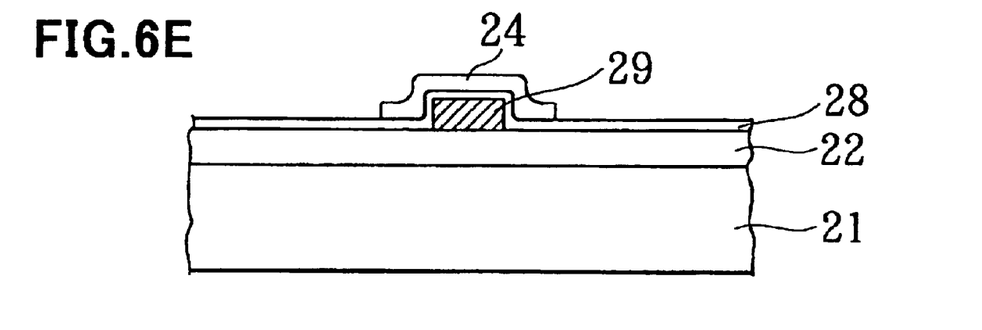

Then, as illustrated in FIG. 6E, the polysilicon film 24 is patterned into an island by photolithography and plasma-etching such that an unnecessary portion of the polysilicon film 24 is selectively removed by the plasma-etching and a portion of the polysilicon film 24 necessary for fabricating a thin film transistor remains unetched. In such plasma-etching, the island-shaped polysilicon film 24 is damaged by static electricity caused by plasma, resulting in that crystal defects are likely to be caused in the polysilicon film 24.

Then, a resist film is formed all over the substrate 21, and patterned into a mask 5 which covers the gate electrode 29 therewith.

Figure 6F:
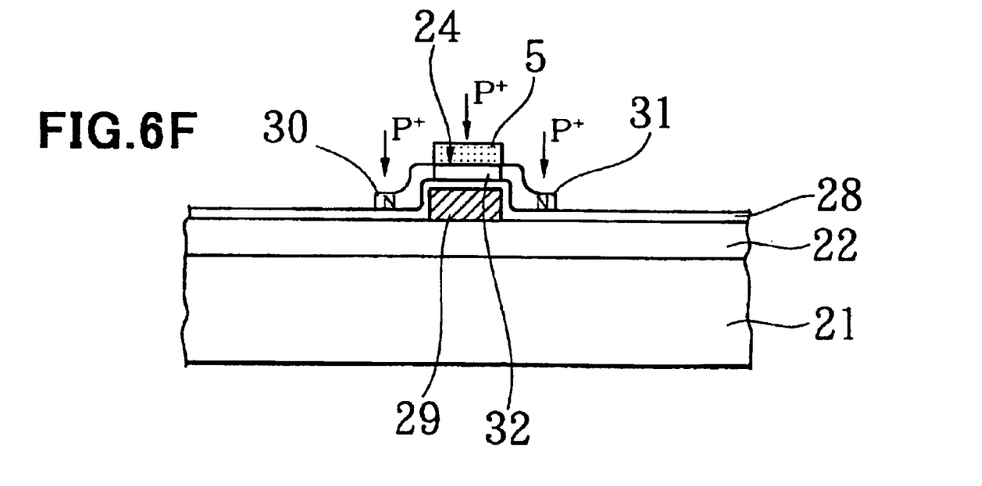

Then, as illustrated in FIG. 6F, ions of n-type impurity such as phosphorus (P) is implanted partially into the polysilicon film 14 with the resist mask 5 being used as a mask, thereby n-type source region 30 and drain region 31 are formed in the polysilicon film 24 around the gate electrode 29, and further, a channel region 32 is formed in an area located above the gate electrode 29 and sandwiched between the source and drain regions 30 and 31.

Then, the polysilicon film 24 into which phosphorus ions were implanted is activated by laser annealing, and then, hydrogen plasma is applied to the polysilicon film 24 such that carriers readily run through the channel region 32.

When the n-type source and drain regions 30 and 31 are formed by implanting ions of n-type impurity into the polysilicon film 24, the source and drain regions 30 and 31 may be designed to have a lightly-doped drain (LDD) structure by carrying out ion-implantation twice in different impurity concentrations, similarly to the first embodiment.

Figure 6G:
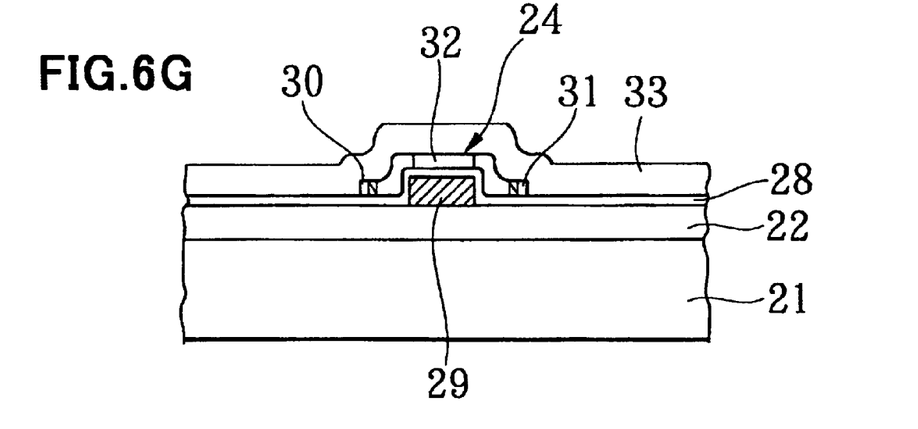

Then, as illustrated in FIG. 6G, an interlayer insulating film 33 is formed all over the substrate 21 by CVD. The interlayer insulating film 33 is composed of silicon oxide and has a thickness of about 300 nm.

Figure 6H:
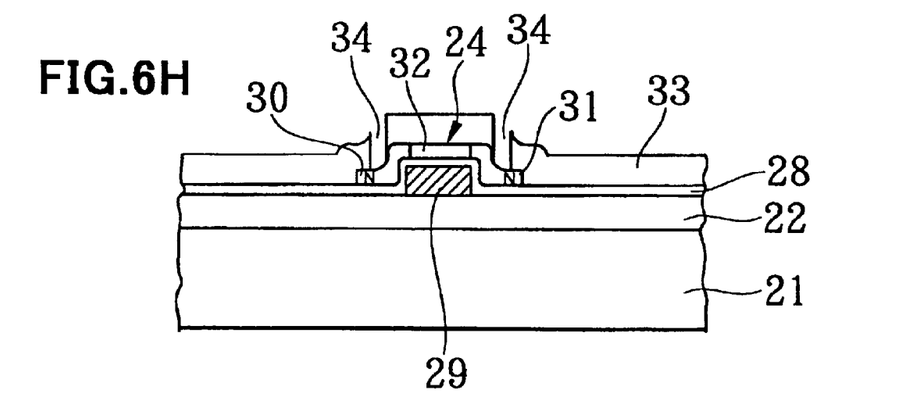

Then, as illustrated in FIG. 6H, an unnecessary portion of the interlayer insulating film 33 is removed by photolithography and plasma-etching, thereby there are formed contact holes 34 throughout the interlayer insulating film 33. The source and drain regions 30 and 31 are partially exposed through the contact holes 34. During the plasma-etching, the polysilicon film 24, the gate insulating film 28, and an interface between the polysilicon film 24 and the gate insulating film 28 are damaged by static electricity caused by plasma, resulting in that crystal defects are likely to be caused in them.

Figure 6I:
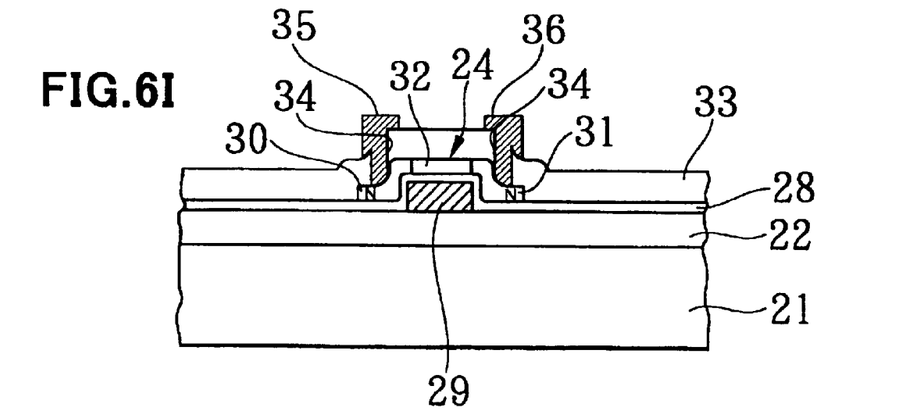

Then, as illustrated in FIG. 6I, an aluminum film is formed all over the substrate 21 by sputtering such that the contact holes 34 are filled with aluminum. Then, the aluminum film is patterned into a desired pattern by removing an unnecessary portion of the aluminum film by photolithography and plasma-etching. Thus, there are formed source and drain electrodes 35 and 36 electrically connecting to the source and drain regions 30 and 31 through the contact holes 34, respectively, and there is further formed a wiring layer (not illustrated). During the plasma-etching, the polysilicon film 24, the gate insulating film 28, and an interface between the polysilicon film 24 and the gate insulating film 28 are damaged by static electricity caused by plasma, resulting in that crystal defects are likely to be caused in them.

Immediately after the formation of the source and drain electrodes 35 and 36, the substrate 21 is put into a furnace, and then, thermally annealed in nitrogen atmosphere in accordance with a temperature profile illustrated in FIG. 4.

Specifically, the substrate 21 is thermally annealed by keeping the furnace at about 300 degrees centigrade in about two hours during t1 to t2, resulting in that crystal defects caused by static electricity during plasma-etching in the polysilicon film 24, the gate insulating film 28, and an interface between the polysilicon film 24 and the gate insulating film 28 are reduced.

Then, there is formed a pixel electrode (not illustrated) electrically connecting to the source electrode 35 or the drain electrode 36. Then, a planarization film and a passivation film (not illustrated) are formed all over a resultant. Thus, a thin film transistor is completed.

Since the third embodiment is identical to the first embodiment except that the gate electrode 29 has a bottom-gate structure, the third embodiment presents the same advantages as those presented by the first embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

For instance, the substrates 1 and 21 are thermally annealed in nitrogen atmosphere at about 300 degrees centigrade for about two hours in the first and second embodiments. According to the experiments having been conducted by the inventors, it is found out that the substrate may be thermally annealed in nitrogen atmosphere at 275 to 350 degrees centigrade for 1.5 to 3 hours.

In the first and second embodiments, the substrates 1 and 21 are thermally annealed in nitrogen atmosphere. According to the experiments having been conducted by the inventors, it is found out that the substrate may be thermally annealed in inert atmosphere other than nitrogen atmosphere. For instance, the substrate may be thermally annealed in argon (Ar), neon (Ne) or helium (He) atmosphere.

In addition, a thin film transistor having a bottom-gate structure in the third embodiment may be designed to have a multi-layered interlayer insulating film, similarly to the second embodiment.

In the first and second embodiments, source and drain electrodes are composed of aluminum. As an alternative, they may be designed to be composed of aluminum alloy predominantly containing aluminum.

As impurity to be implanted into a thin semiconductor layer for forming n-type source and drain regions, antimony (Sb) may be selected in place of phosphorus (P). As an alternative, p-type source and drain regions may be formed in place of n-type source and drain regions, in which case, ions of p-type impurity such as boron are implanted into a thin semiconductor layer.

Thicknesses of an electrically insulating substrate, an underlying film, a thin semiconductor layer, a gate insulating film, a gate electrode, and an interlayer insulating film are just an example, and may be changed to appropriate thicknesses.

The entire disclosure of Japanese Patent Application No. 2002-237048 filed on Aug. 15, 2002 including specification, claims, drawings and summary is incorporated herein by reference in its entirety.

What is claimed is:

1. A method of fabricating a thin film transistor including an electrically insulating substrate, a semiconductor layer formed on said substrate, and source and drain electrodes formed above source and drain regions formed in said semiconductor layer, said source and drain electrodes being composed of aluminum or aluminum alloy, said method comprising the steps of:

(a) forming a gate electrode electrically insulated from said semiconductor layer through a gate insulating film;

(b) implanting ions of impurity having a predetermined electrical conductivity, into at least a part of said semiconductor layer for forming said source and drain regions;

(c) forming an interlayer insulating film entirely over said substrate;

(d) forming contact holes throughout said interlayer insulating film such that at least a part of said source and drain regions is exposed through said contact holes;

(e) forming an electrically conductive film composed of aluminum or aluminum alloy, in said contact holes for forming said source and drain electrodes electrically connecting said source and drain regions through said contact holes; and (f) immediately after said step (e), thermally annealing said substrate at 275 to 350 degrees centigrade for 1.5 to 3 hours in inert atmosphere.

2. The method as set forth in claim 1, wherein said gate electrode is formed above said semiconductor layer in said step (a).

3. The method as set forth in claim 1, wherein said gate electrode is formed below said semiconductor layer in said step (a).

4. The method as set forth in claim 1, wherein said gate electrode is used as a mask in formation of said source and drain regions in said step (b).

5. The method as set forth in claim 1, wherein said ions are implanted twice into said semiconductor layer in said step (b) in different impurity concentrations such that the resultant source and drain regions have a lightly-doped drain (LDD) structure.

6. The method as set forth in claim 1, further comprising the step of (g) activating said semiconductor layer and applying hydrogen-plasma to said semiconductor layer, said step (g) being to be carried out between said steps (b) and (c).

7. The method as set forth in claim 1, wherein said interlayer insulating film is formed in said step (c) so as to have a multi-layered structure.

8. The method as set forth in claim 1, wherein said semiconductor layer is comprised of a polysilicon film.

9. The method as set forth in claim 1, wherein said substrate is thermally annealed in said step (f) in a nitrogen, arson, neon or helium atmosphere.

10. A method of fabricating a thin film transistor including an electrically insulating substrate, a semiconductor layer formed on said substrate, and source and drain electrodes formed above source and drain regions formed in said semiconductor layer, said source and drain electrodes being composed of aluminum or aluminum alloy, said method comprising the steps of:

(a) forming a gate electrode electrically insulated from said semiconductor layer through a gate insulating film;

(b) implanting ions of impurity having a predetermined electrical conductivity, into at least a part of said semiconductor layer for forming said source and drain regions;

(c) forming an interlayer insulating film entirely over said substrate;

(d) forming contact holes throughout said interlayer insulating film such that at least a part of said source and drain regions is exposed through said contact holes;

(e) forming an electrically conductive film composed of aluminum or aluminum alloy, in said contact holes for forming said source and drain electrodes electrically connecting said source and drain regions through said contact holes; and (f) immediately after said step (e), thermally annealing said substrate in an inert atmosphere.

11. The method as set forth in claim 10, wherein said annealing is performed at least 275 degrees centigrade.

12. The method as set forth in claim 10, wherein said annealing is performed at 275 to 350 degrees centigrade.

13. The method as set forth in claim 10, wherein said annealing is performed for at least 1.5 hours.

14. The method as set forth in claim 10, wherein said annealing is performed for 1.5 to 3 hours.

15. The method as set forth in claim 10, further comprising the step of (g) forming a pixel electrode which electri cally connects said source electrode to said drain electrode, said step (g) being to be carried out after said step (f).

16. The method as set forth in claim 15, further comprising the step of (h) forming a planarization film and a passivation film over the resultant device of claim 15, said step (h) being to be carried out after said step (g).

17. The method as set forth in claim 10, wherein said gate electrode is formed above said semiconductor layer in said step (a).

18. The method as set forth in claim 10, wherein said gate electrode is formed below said semiconductor layer in said step (a).

19. The method as set forth in claim 10, wherein said interlayer insulating film is formed in said step (c) so as to have a multi-layered structure.

* * * * *